US009281836B2

(12) United States Patent
Lim et al.

(10) Patent No.: US 9,281,836 B2

(45) Date of Patent: Mar. 8, 2016

(54) SWITCHING NOISE RESISTANT INTEGRATING ANALOG-DIGITAL CONVERTER

(71) Applicant: Magnachip Semiconductor, Ltd., Cheongju-si (KR)

(72) Inventors: Dae Ho Lim, Cheongju-si (KR); Yong Sup Lee, Cheongju-si (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 14/537,190

(22) Filed: Nov. 10, 2014

(65) Prior Publication Data

US 2015/0244389 A1 Aug. 27, 2015

(30) Foreign Application Priority Data

Feb. 24, 2014 (KR) ........................ 10-2014-0021543

(51) Int. Cl.

*H03M 1/34* (2006.01)
*H03M 1/00* (2006.01)
*H03M 1/08* (2006.01)

(52) U.S. Cl.

CPC .............. *H03M 1/345* (2013.01); *H03M 1/002* (2013.01); *H03M 1/0863* (2013.01)

(58) Field of Classification Search

CPC ......... H03M 1/002; H03M 1/12; H03M 1/14; H03M 1/50; H03M 1/52; H03M 1/60; H03M 1/66; H03M 1/56; H03M 1/123; H03M 1/089; H03M 1/466; H03M 1/0607; H03M 1/0682

USPC .......... 341/156, 164, 166, 118, 144, 155, 172

See application file for complete search history.

(56) References Cited

U.S. PATENT DOCUMENTS 3,879,724 A * 4/1975 McDonald .................... 341/131
4,364,028 A * 12/1982 Masuda et al. ................ 341/118
5,101,206 A * 3/1992 Riedel ........................... 341/156
5,117,227 A 5/1992 Goeke
5,148,171 A * 9/1992 Blumberg ..................... 341/168
5,184,128 A * 2/1993 Snow ............................ 341/128
5,200,752 A * 4/1993 Goeke ........................... 341/168
5,216,426 A * 6/1993 Ishioka ......................... 341/168
5,367,302 A * 11/1994 Kalthoff et al. ............... 341/166
6,243,034 B1 * 6/2001 Regier .......................... 341/166
7,583,210 B2 * 9/2009 Minobe ......................... 341/118
8,704,697 B2 * 4/2014 Lin .............................. 341/172
8,836,567 B2 * 9/2014 Lin .............................. 341/172
9,024,797 B2 * 5/2015 Feldotte et al. ............... 341/158

* cited by examiner

*Primary Examiner* — Lam T Mai
(74) *Attorney, Agent, or Firm* — NSIP Law

(57) ABSTRACT

Provided is an integrating analog-digital converter. According to the present examples, the resistance against external noise is improved by incorporating a differential amplifier into an integrating analog-digital converter. Some examples also include a section where an input voltage and a reference voltage are simultaneously blocked such that switching noise may be minimized and a reference voltage may also be stably supplied. Further, examples are designed to manage a residue, which may be generated when an integral operation to an analog input value is finished, to be processed not in an additional converter but in control logic itself, thereby reducing a size of a circuit device.

20 Claims, 5 Drawing Sheets

100
150
160
140
130
110
120
170
VINTN
VINTP
SW5
CF
RF
R
SW4
SW2
SW3
SW1
a
b
SW1'
SW2'
SW3'
Irp
Irn
Iinp
Iinn
VRFP
VRFN
VINP
VINN
CONTROL LOGIC UNIT
FINAL OUTPUT VALUE
SWITCH CONTROL SIGNAL

SWITCHING NOISE RESISTANT INTEGRATING ANALOG-DIGITAL CONVERTER

CROSS-REFERENCE TO RELATED APPLICATIONS

This application claims the benefit under 35 U.S.C. §119 (a) of Korean Patent Application No. 10-2014-0021543 filed on Feb. 24, 2014, in the Korean Intellectual Property Office, the entire disclosure of which is incorporated herein by reference for all purposes.

BACKGROUND

1. Field

The following description relates to an integrating analog-digital converter. The following description also relates to an integrating analog-digital converter configured to be resistant to switching noise when converting an analog input signal to a digital output signal and configured to reduce power consumption so as to improve an integrating analog-digital converter.

2. Description of Related Art

An analog-digital converter denotes a device through which an analog physical quantity such as voltage, current, temperature, humidity, pressure, flux, speed, or another physical quantity that takes on a continuous range of values is converted to a digital signal with discrete values. By using such a digital signal, arithmetic is easier, results are more accurate, and the information is easier to process as required. However, as a processing speed of the digital signal increases more and more and a high-resolution digital representation of the analog sign is required, it is helpful for the analog-digital converter, which is one of the core circuits used in this context, to feature a high-resolution.

For example, the analog-digital converter is employed along with a sensor and a computer and other related hardware, or the analog-digital converter is deployed inside a sensor. Here, the sensor is a device that converts the continuous physical quantity to be measured, into a corresponding electrical signal with a corresponding characteristic such as voltage, current or frequency. The analog-digital converter serves to convert the quantity of electricity to a parallel or serial data stream that is readable by a computer. Specifically, the analog-digital converter converts an analog signal to a digital signal at a rapid speed accurately in order to perform real time digital signal processing. The performance of the said analog-digital converter thus determines quality of the sensor or entire system.

With respect to such an analog-digital converter, there are many varieties, such as a coefficient approximation type, a successive approximation type, a flash analog-digital converter (ADC), and an integrator. Among these, an integrating analog-digital converter operates in a manner that integrates a reference voltage that is received along with an analog input voltage under an initial state, until an output of integrator assumes a ground value of zero and operates in a manner that counts the integration time. Therefore, the integrating analog-digital converter operates as a converter device that provides certain characteristics in a sensor apparatus or a measuring apparatus, in regards to realizing a high-resolution, a few offset, and a few gain errors compared with other analog-digital converter.

An integrating analog-digital converter, as shown in FIG. 1, includes an operational amplifier 10 configured to receive a positive reference voltage +VREF or a negative reference voltage −VREF along with an input voltage VIN, whose output is connected to a capacitor C1. The integrating analog-digital converter of FIG. 1 also includes a comparator 20 configured to be connected with the output of the operational amplifier 10. The comparator 20 has the characteristic that an inverting terminal (−) is connected with the output of the operational amplifier 10 and that a non-inverting terminal (+) is grounded.

The integrating analog-digital converter of FIG. 1 is configured such that an operational amplifier 10 receives the positive reference voltage +VREF or the negative reference voltage −VREF together with an input voltage VIN through an inverting terminal (−), by means of a switch SW that operates in accordance with a switch control signal of the integrator logic, under an initial reset state. The input voltage VIN is then charged, during a run-up section, due to using a resistor R1 and a capacitor C1. When the charging is completed, a discharge, during a run-down section, that then takes place according to a switching operation.

Accordingly, the analog value outputs a clock pulse that is compared in the comparator 20. An integral logic unit 30 then counts a clock pulse of a specific frequency that is outputted in the comparator 20 during the time at which the capacitor $C_1$ is discharged. Thus, the comparator 20 outputs a high level when a voltage applied to the inverting terminal (−) of the comparator 20 falls onto the ground level. Thus, a high level value is counted, which is outputted for a specific duration of time in this manner.

However, the aforesaid integrating analog-digital converter presents the following issues.

First, in the integrating analog-digital converter of FIG. 1, a switch SW that operates to provide the positive reference voltage +VREF or the negative reference voltage −VREF to an operational amplifier, is selected in accordance with a level of an input voltage VIN when the capacitor C1 is discharged. As this occurs, due to the switching noise, some situations may take place in which a switch SW does not operate accurately. For example, phenomena may thus take place, where the positive reference voltage +VREF or the negative reference voltage −VREF is not provided to the operational amplifier 10 having a predetermined magnitude. As a result, it thus disadvantageously causes the conversion capabilities of the integrating analog-digital converter to be impaired. Furthermore, in cases where such an integrating analog-digital converter is applied to a sensor, a sensing capability may be generally degraded.

Further, in the integrating analog-digital converter of FIG. 1, there exists a section that simultaneously receives or simultaneously blocks a positive reference voltage +VREF and a negative reference voltage −VREF so as to cope with noise that is generated when a switch SW is involved in a switching operation when integrating. However in this approach, all of the switches assume a turned on state, and relatively more power is thereby consumed.

Additionally, the integrating analog-digital converter of FIG. 1 realizes a resistor-capacitor (R-C) integrator using an operational amplifier 10, such that a bulk capacitor C1 and a resistor R1 are to be used.

Furthermore, in some approaches there exists a residue bit of which an input voltage is not used when converting from analog to digital. Here, the residue bit is a usual '1' bit, and becomes '0' or '1'. However, the residue bit is a reason why a resolution is degraded because of the incorporation of unused bits. Some approaches provide a structure of processing the residue bit. Thus, in some approaches, an analog-digital converter containing structure specialized for processing the residue bit is additionally used. This leads to another disadvantage of enlarged circuit size.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

The present examples are intended to address the foregoing issues of analog-digital converters, and an object of the present examples is to provide an integrating analog-digital converter configured to be resistant to an external noise source.

Another object of the present examples is to provide an integrating analog-digital converter configured to minimize a switching noise and to reduce power consumption in a manner to simultaneously block an input voltage and a reference voltage while performing an integration operation.

Another object of the present examples is to provide an integrating analog-digital converter configured to reduce a circuit size in a manner to logically process a residue bit for which a conversion is not processed when converting from analog to digital.

According to one example, an integrating analog-digital converter includes an input unit configured to receive an input voltage and a predetermined reference voltage, a differential amplifier configured to receive a differential input voltage based on the input voltage that is outputted through an output terminal of the input unit, a comparator configured to compare a differential output voltage that is outputted from the differential amplifier, and a control logic unit configured to output a counted digital output value, in accordance with a result of the comparator, as a final output value.

The input unit may include a first switch that is connected with a node configured to be provided with a positive input voltage, a second switch that is connected with a node configured to be provided with a negative input voltage, a third switch and a fourth switch that are connected with a node configured to be provided with a positive reference voltage, a fifth switch and a sixth switch that are connected with a node configured to be provided with a negative reference voltage, and additional switches that are connected with respective rear ends of the first switch, the second switch, a first node connecting the third switch and the fifth switch, and a second node connecting the fourth switch and the sixth switch.

The control logic unit may output a switch control signal that turns-on and turns-off the third switch, the fourth switch, the fifth switch, the sixth switch, and the additional switches among the switches based on a result of the comparator, and the additional switches may be simultaneously turned-on and turned-off.

The third switch and the fifth switch and the fourth switch and the sixth switch may operate in opposite states to each other, and wherein in response the third switch and the sixth switch, and the fourth switch and the fifth switch shifting a state, the additional switches may be simultaneously placed in a turned-off state.

In a time period in which the additional switches are turned off, an inverting input voltage and a non-inverting input voltage of the differential amplifier are in a floating state or the differential output voltage of the differential amplifier may be maintained as being unchanged.

In response to the additional switches being in a turned-off state, all of the reference voltages and the input voltages may be blocked from providing a supply.

In response to the additional switches being turned on again, if the additional switches are initially turned-off, and the third switch and the sixth switch and the fourth switch and the fifth switch may shift a state, and a state shift is then complete.

A result of the comparator may be a high level signal that is outputted in response to a positive output voltage and a negative output voltage of the differential amplifier being identical to each other.

The positive output voltage and the negative output voltage may have a run-up section, a floating section and a run-down section during a cycle.

A resolution of the integrating analog-digital converter may be determined by controlling a ratio of the length of the run-up section and the length of the run-down section, and a number of cycles of repetition.

The control logic unit may verify a presence or an absence of a residue bit based on the result of the comparator.

The control logic unit may output the final output value based only on the result of the comparator in response to the residue bit being absent.

The final output value may be determined by subtracting the total number of the run-ups from the total number of the run-downs.

The control logic unit may output the final output value based on recalculating according to an output state of the comparator, in response to the residue bit being present.

The control logic unit, in response to an output state of the comparator being negative, may output a value for which a time discharged to a negative reference voltage is counted by adding a first calculation value, as the final output value.

The control logic unit, in response to an output value of the comparator being positive, outputs a value for which a time charged to a positive reference voltage is counted by subtracting a first calculation value, as the final output value.

The first calculation value may be defined by subtracting the total number of the run-ups from the total number of the run-downs during a cycle of the converter.

The first calculation value may be defined by subtracting the total number of the run-ups from the total number of the run-downs during a cycle of the converter.

In response to a difference between the positive input voltage and the negative input voltage being 0, the control logic unit outputs the final output value as 0.

In another general aspect, an integrating analog-digital converter includes a differential amplifier configured to receive a differential input voltage based on an input voltage and a predetermined reference voltage from an input unit, wherein the transmission of the input voltage and the predetermined reference voltage into the differential amplifier is regulated by switches, a comparator configured to compare a differential output voltage that is outputted from the differential amplifier, and a control logic unit configured to output a counted digital output value, in accordance with a result of the comparator, as a final output value, and configured to output a switch control signal that controls the switches in accordance with a result of the comparator.

The integrating analog-digital converter configured as discussed above according to various examples provides the following advantageous effects.

In accordance with the integrating analog-digital converter of the present examples which is configured as above, there are effects as follows.

First, the present examples are designed to use a differential amplifier configured to receive two input values as part of an integrating analog-digital converter and to use the difference value. Thus, the resistance against an external noise is improved in comparison with other analog-digital converters.

Also, in the other integrating analog-digital converters, a positive reference voltage $+V_{REF}$ and a negative reference voltage $-V_{REF}$ are simultaneously applied or simultaneously blocked so as to manage a switching noise that occurs when integrating. On the contrary, the present examples include circuits to simultaneously block all of the input voltage and the reference voltages, thereby minimizing power consumption. Also, according to such a circuit configuration of examples, it potentially becomes possible to stably provide a positive reference voltage VRFP or a negative reference voltage VRFN.

Moreover, the present examples are designed such that the residue bit, which is potentially generated when integrating, is processed in the control logic without using additional analog-digital converter circuitry. The size and complexity of the entire system is thus reduced.

Other features and aspects will be apparent from the following detailed description, the drawings, and the claims.

Figure 1:
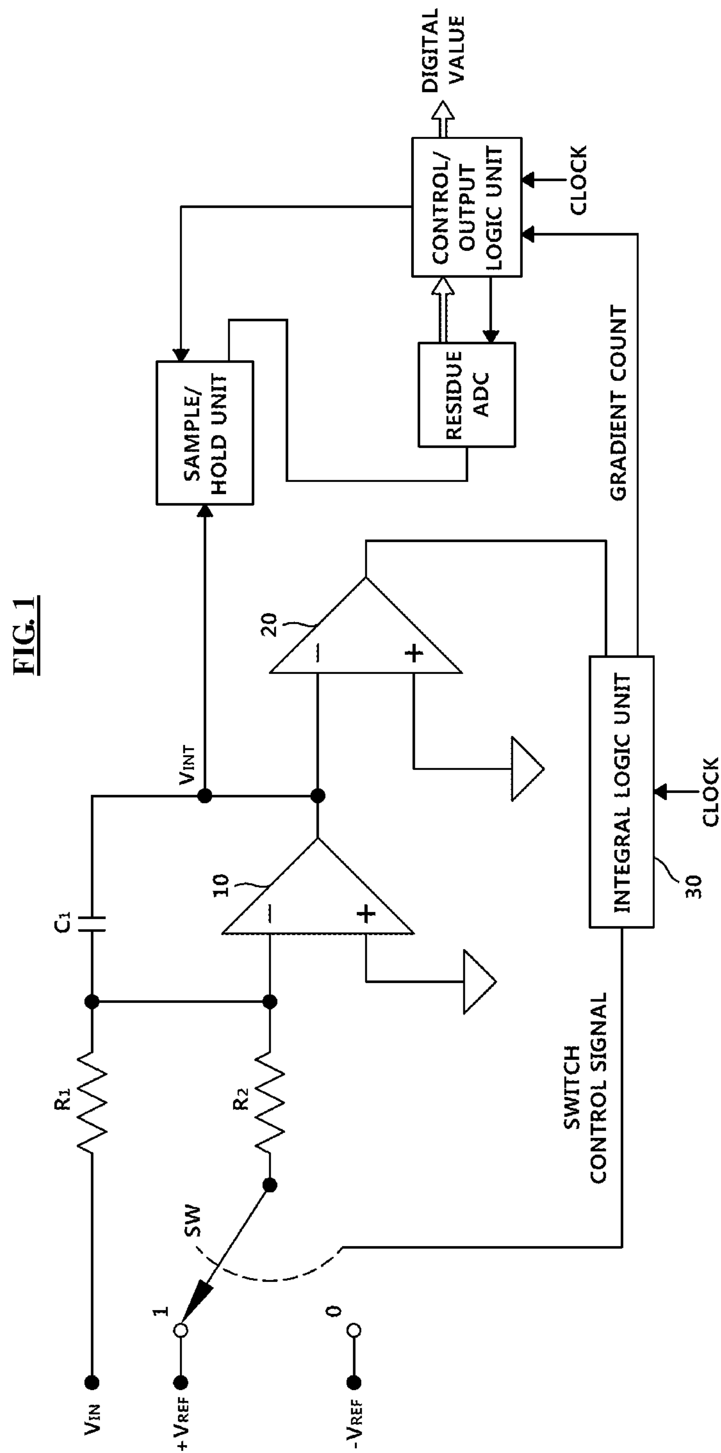
FIG. 1 is a constitutional view of a circuit of an integrating analog-digital converter.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

The present examples provide the characteristics of being resistant to a switching noise that is generated when integrating in an integrating analog-digital converter. The examples achieve this effect by applying a differential amplifier to an integrating analog-digital converter and simultaneously blocking positive and negative input voltages and positive and negative reference voltages, so that thereby a switch is balanced. Additionally, a circuit size is reduced by reducing the structure used for processing a residue bit in control logic.

Subsequently, there is described further a view of an integrating analog-digital converter in accordance with the present examples that provides the aforementioned technical characteristics with reference to the accompanying drawings.

Figure 2:
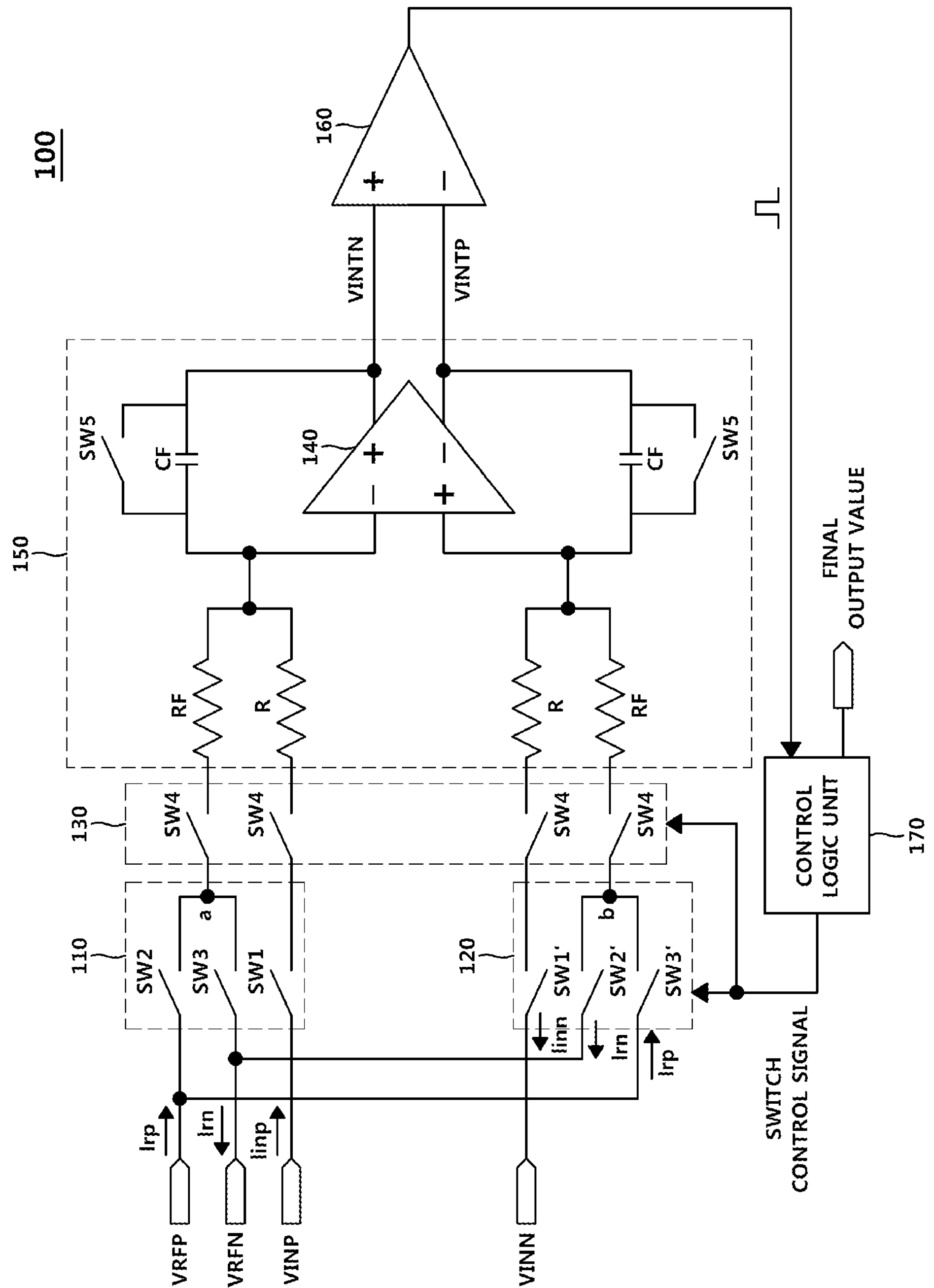
FIG. 2 is a constitutional view of a circuit showing an integrating analog-digital converter according to an example.

FIG. 2 is a constitutional view of a circuit showing an integrating analog-digital converter according to an example.

As shown in FIG. 2, in the integrating analog-digital converter 100, there is included an input unit that receives an analog input voltage and a reference voltage and in which switches are configured to operate in on/off states according to a switching signal.

Thus, the input unit includes a first input unit 110 including switches SW1, SW2, and SW3 that are connected with a node configured to receive a positive input voltage VINP, a positive reference voltage VRFP and a negative reference voltage VRFN. The input unit further includes a second input unit 120 including switches SW1', SW2', and SW3' that are connected with a node configured to receive a negative input voltage VINN, a negative reference voltage VRFN and a positive reference voltage VRFP. Here, a positive reference voltage VRFP, a negative reference voltage VRFN, a positive input voltage VINP, and a negative input voltage VINN denote voltages having a difference value of the same magnitude based on a common voltage VCOM, where the signs of the voltages are opposite to each other.

The input unit includes a third input unit 130. The third input unit 130 plays a role in reducing a switching noise when the switches SW2 and SW3, and SW2' and SW3' operate by switching between on/off states and is connected with rear ends of the first input unit 110 and the second input unit 120. In such a third input unit 130, four switches are configured. Accordingly, there are two switches that are respectively connected with the switches SW1 and SW1', a switch that is connected with a connection node “a” of switches SW2 and SW3, and a switch that is connected with a connection node “b” of switches SW2' and SW3'. In the example of FIG. 2, all of these switches are labeled as SW4. The SW4 switches are simultaneously turned on or off together according to a logic that operates to control the switches. Here, because of a state in which all of the SW4 switches are turned off, that is, a state in which a current inputted to a differential amplifier 140 becomes ‘0’, and no current is inputted to a capacitor CF, output voltages VINTP and VINTN maintain their value held right before the SW4 switches are turned off, and remain unchanged.

The third input unit 130 is connected with a differential amplifier 140 that operates by receiving a differential input voltage. Namely, a difference value (−) of positive input voltage VINP and negative input voltage VINN is inputted as an input voltage. Of course, a common voltage VCOM is applied to the differential amplifier 140. Usually the common voltage VCOM has a magnitude of about ½ of a source voltage VDD. Between an inverting terminal (−) and a non-inverting terminal (+) of the differential amplifier 140 and an output terminal having positive and negative values, a feedback capacitor CF is respectively connected. The feedback capacitor CF serves to charge or discharge an input voltage that is stored during charge and discharge sections. Here, a switch SW5 is configured, which is respectively connected in parallel to the feedback capacitor CF for controlling the charge or discharge.

Likewise, the example presented here makes it possible to be resistant to external noise and to output an output value stably since an integrating analog-digital converter 100 uses a differential amplifier 140, as discussed. In the meanwhile, resistors RF, R connected to the rear ends of the switches SW4, the differential amplifier 140, and capacitor CF serve as an integrator 150. In FIG. 2, the switches SW5 are also part of the integrator 150.

A comparator 160 is connected to an output of the differential amplifier 140. The comparator 160 compares a positive output voltage VINTP and a negative output voltage VINTN that are delivered as output from the differential amplifier 140. Also, the comparator 160 outputs a high level value when the positive output voltage VINTP and the negative output voltage VINTN become identical to each other or when the negative output voltage VINTN becomes bigger than the positive output voltage VINTP after a preset time. Here, the comparator 160 was previously in a state that outputs a low level value.

A control logic unit 170 is configured to output an analog voltage value as a final output value of the conversion, which is based upon delivery of a comparison result of the comparator 160. The control logic unit 170 is also configured to control on/off operation of the switches, that is, SW1, SW2, SW3, SW1', SW2', SW3', and SW4. Here, a final output value which the control logic unit 170 outputs are calculated differently according to a presence or an absence of a residue bit. Such handling of a residue bit is discussed further, below.

An application of the integrating analog-digital convertor configured as above is considered. Such an application is described with reference to FIG. 3 that shows an example of the operation of the integrating analog-digital converter.

Figure 3:
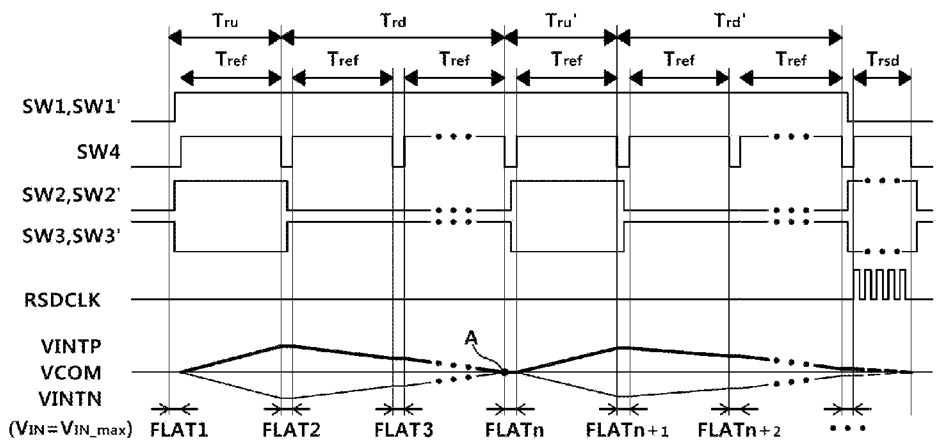
FIG. 3 is an operation timing view showing an example of the operation of the integrating analog-digital converter of FIG. 2.

First, considering an integral cycle of the integrating analog-digital convertor of the example with reference to FIG. 3, when a cycle of a basic operation is $T_{Tref}$, the positive input voltage VINP is at a maximum VINP_max, and the negative input voltage VINN is minimum VINN_min. Accordingly, a section where $T_{ru}$ section and $T_{rd}$ section are integrated becomes one integral cycle. A resolution of the integrating analog-digital converter is then determined according to the number for which a ratio of the $T_{ru}$ section and $T_{rd}$ section and a corresponding cycle are repeated. Here, the ratio of $T_{ru}$ section and $T_{rd}$ section on the basis of Tref section is related by a ratio of 1:N. Where N is 9 for example, an operation takes place nine times in which $T_{ref}$ section and SW4 are shifted from a turned-on state to a turned-off state during $T_{rd}$ section.

Accordingly, an operation of the integrating analog-digital converter first generates a run-up section.

The run-up section starts with the positive input voltage VINP and the negative input voltage VINN being applied from outside under an initial reset state. Here, the positive input voltage VINP and the negative input voltage VINN are analog values.

A control logic unit 170 then controls all of SW1, SW1', SW2, SW2', and SW4 to turn them on. Accordingly, the positive input voltage VINP is applied to an inverting terminal (−) of the differential amplifier 140 through SW1 and SW4. Here, the positive reference voltage VRFP is applied to a non-inverting terminal (−) of the differential amplifier 140 through SW2 and SW4. That is, the positive reference voltage VRFP being loaded with the positive input voltage VINP are to be applied together. Also, the negative input voltage VINN is applied to a non-inverting terminal (+) of the differential amplifier 140 through SW1' and SW4. Here, the negative reference voltage VRFN is also applied to a non-inverting terminal (+) of the differential amplifier 140 through SW2' and SW4. That is, the negative reference voltage VRFN being loaded with the negative input voltage VINN are to be applied together.

As a result, among output voltages of the differential amplifier 140, the positive output voltage VINTP becomes much greater, having a specific gradient on the basis of a common voltage VCOM in such a manner that the negative input current $I_{inn}$ and the negative reference voltage current $I_{rn}$ are added. Conversely, the output voltage VINTN becomes much less, having a specific gradient on the basis of a common voltage VCOM. Such a state corresponds to $T_{ru}$, section in FIG. 3 and is to be a run-up section. That is to say, it can be identified that the positive output voltage VINTP and the output voltage VINTN are symmetrically divergent from the basis of a common voltage VCOM.

Thereafter, while the run-up section proceeds, when a preset time period elapses, a run-down section then proceeds. An entry to the run-down section causes the SW4*s* to be turned-off for a specific duration of time. The control logic unit 170 then outputs a switch control signal commencing the run-down operation. That is, the switch control signal is a signal that renders SW1 and SW1' as being continuously turned-on, SW2 and SW2' as being turned-off, and SW3 and SW3' as being turned-on. Additionally, after the other switches operate, the control logic unit turns the SW4*s* on again. Here, when the SW4*s* are in a turned-off state, positive output voltage VINTP and negative output voltage VINTN assume a floating state. Hence, during the SW4*s* being turned-off, as 'FLAT 1', 'FLAT 2', 'FLAT 3', 'FLAT n', 'FLAT n+1', 'FLAT n+2' in FIG. 3, the positive output voltage VINTP and the negative output voltage VINTN are maintained as being in a flat state.

When the run-down section arrives, the positive input voltage VINP is applied to an inverting terminal (−) of a differential amplifier 140 through SW1 and SW4. Here, the negative reference voltage VRFN is applied to an inverting terminal (−) of the differential amplifier 140 through SW3 and SW4. Also, the negative input voltage VINN is applied to a non-inverting terminal (+) of a differential amplifier 140 through SW1' and SW4. Here, a positive reference voltage VRFP is applied to a non-inverting terminal (+) of a differential amplifier 140 through SW3' and SW4.

As a result, among output voltages of the differential amplifier 140, a positive output voltage VINTP becomes small having a specific gradient due to a current value of the negative reference voltage VRFN that has a higher negative current value than negative input current $I_{inn}$. The negative output voltage VINTN also becomes small, having a corresponding specific gradient as well. Here, becoming small by having a specific gradient indicates that positive output voltage VINTP and negative output voltage VINTN get close to a horizontal line of a common voltage VCOM. Such a state is illustrated as $T_{rd}$ section in FIG. 3 and becomes a run-down section.

In this manner, like the $T_{rd}$ section, the positive output voltage VINTP gradually decreases, while the negative output voltage VINTN gradually increases, these voltages being applied to the comparator 160.

The comparator 160 then compares, on an ongoing basis, the positive output voltage VINTP and the negative output voltage VINTN. Until then, the comparator 160 outputs a low level signal. Thereafter upon comparing the result, if a point arrives at which the positive output voltage VINTP and the negative output voltage VINTN become identical, or at which the positive output voltage VINTP and the negative output voltage VINTN intersect, a high level signal is then outputted. Here, the intersection indicates a point at which the positive output voltage VINTP becomes smaller than the negative output voltage VINTN or, vice versa, at which the negative output voltage VINTN becomes accordingly larger than the positive output voltage VINTP. When such intersection points arrive, the comparator 160 then outputs a high level signal. Such a point is designated as A in FIG. 3.

The high level signal outputted from the comparator 160 is delivered to the control logic unit 170. The control logic unit 170 then recognizes that an integral operation regarding the positive input voltage VINP and the negative input voltage VINN, which are inputted as analog values, is completed for one cycle and indicates a high level signal. In addition, the control logic unit 170 outputs a switch control signal in order to implement a subsequent cycle run-up section, that is, $T_{ru}'$ section of FIG. 3.

The switch control signal becomes a signal that maintains switches SW1 and SW1' to be continuously turned-on and switches SW3 and SW3' to be turned-off and switches sw2 and sw2' to be turned-on. However, even in this case, SW4*s* are turned-off and then turned-on again.

Therefore, the above-described $T_{ru}$ section is again implemented. Subsequently, if the $T_{ru}'$ section is completed, the $T_{rd}'$ section is implemented. That is, referring to drawings, it is shown that $T_{ru}'$ section and $T_{rd}'$ section are implemented again, such that the $T_{ru}$ and $T_{ru}'$, and the corresponding $T_{rd}$ and $T_{rd}'$ indicate sections of run-up and run-down respectively and implement the same operation.

Figure 4:
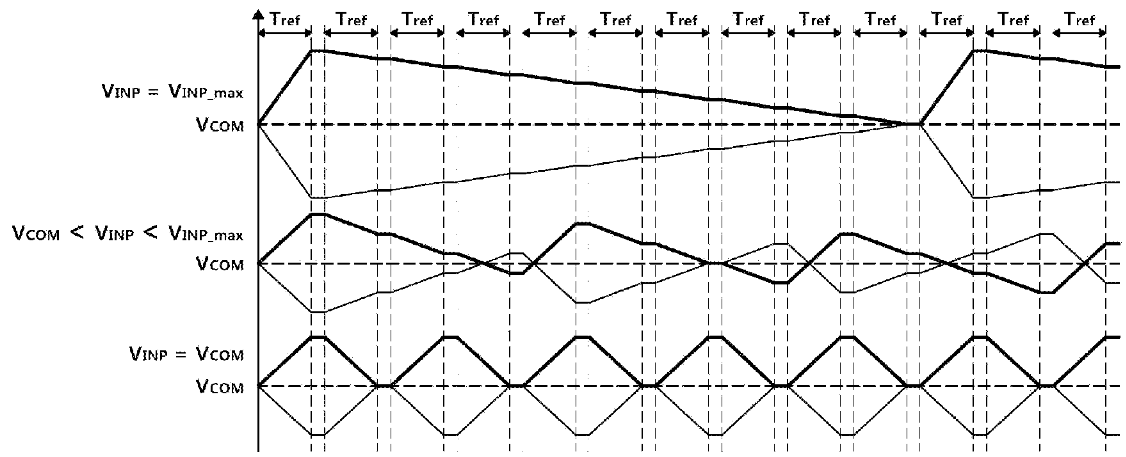
FIG. 4 is a view showing changes of a $T_{ru}$ section and a $T_{rd}$ section according to a voltage magnitude of positive input voltage VINP and negative input voltage VINN.

FIG. 4 is a view showing changes of a $T_{ru}$ section and a $T_{rd}$ section according to a voltage magnitude of the positive input voltage VINP and the negative input voltage VINN.

Referring to FIG. 4, when the input voltage VINP is a maximum value VINP_max of the positive input voltage and when the negative input voltage VINN is a minimum value VINN_min of the negative input voltage. The amount of current inputted in $T_{ru}$ section, $I_{inp\_max}+I_{rp}$, assumes a maximum value, and the amount of current inputted in Trd section, $I_{inp\_max}-I_{rn}$, assumes minimum value and thus a ratio corresponding to the $T_{ru}$ section and $T_{rd}$ section assumes a maximum value. Also, if the positive input voltage VINP is larger than VCOM and smaller than VINP_max, an input current of the $T_{ru}$ section, $I_{inp}+I_{rp}$, decreases and the amount of input current of $T_{rd}$ section, $I_{inp}-I_{inn}$ increases and hence a ratio of the $T_{rn}$ section and the $T_{rd}$ section becomes small gradually. Also, if the positive input voltage VINP and the negative input voltage VINN becomes equal to VCOM, the amount of input current of $T_{ru}$ section, $I_{rp}$, and the amount of input current of $T_{rd}$ section, $-I_{rn}$ become the same, and thereby a ratio of $T_{ru}$ section and $T_{rd}$ section becomes 1:1.

The run-up and the run-down sections are repeatedly implemented continuously as discussed, and the repeated number proceeds until the preset number, according to a desired resolution. According to the comparison result of the positive output voltage VINTP and the negative output voltage VINTN in the run-down section, when a point, as discussed, arrives at which the positive output voltage VINTP and the negative output voltage VINTN become the same, or at which the positive output voltage VINTP becomes smaller than the negative output voltage VINTN or, vice versa, at which the negative output voltage VINTN becomes accordingly larger than the positive output voltage VINTP, each time a control logic unit 170 receives a high level signal that is outputted from the comparator 160.

As a result, the control logic unit 170 has the capability to verify the total number of run-downs and the total number of run-ups which are delivered from the comparator 160, with respect to an analog input value applied from outside for a preset time period. Further, the control logic unit 170 outputs a value that is calculated by subtracting the total number of run-ups from the total number of run-downs, hereinafter, referred to as a "first calculation value," as a final output value. Here, the final output value corresponds to a point at which the preset repeated number is completed in accordance with a corresponding resolution.

In other words, the integrating analog-digital converter is configured such that the total number of run-ups and the total number of run-downs are changed in accordance with a magnitude of the analog input value, as illustrated in FIG. 4. However, there may exist a residue bit of which an integral operation is unprocessed at the time of completion, since a preset total number of repetitions are completed. In some approaches, if there is a residue bit as discussed above, an additional analog-digital converter is used to process the residue bit. In other cases that fail to process the residue bit, there is a problem in that a resolution is degraded.

Figure 5:
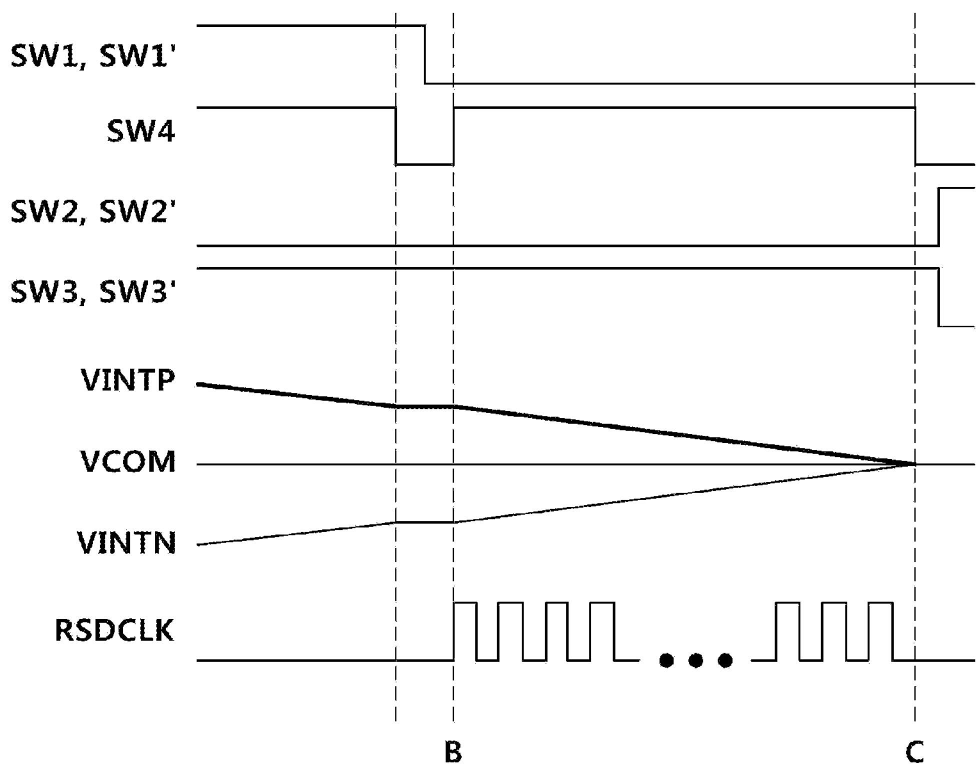
FIGS. 5 and 6 are example views showing a state where a residue bit is generated in the operational timing view of FIG. 3.
Figure 6:
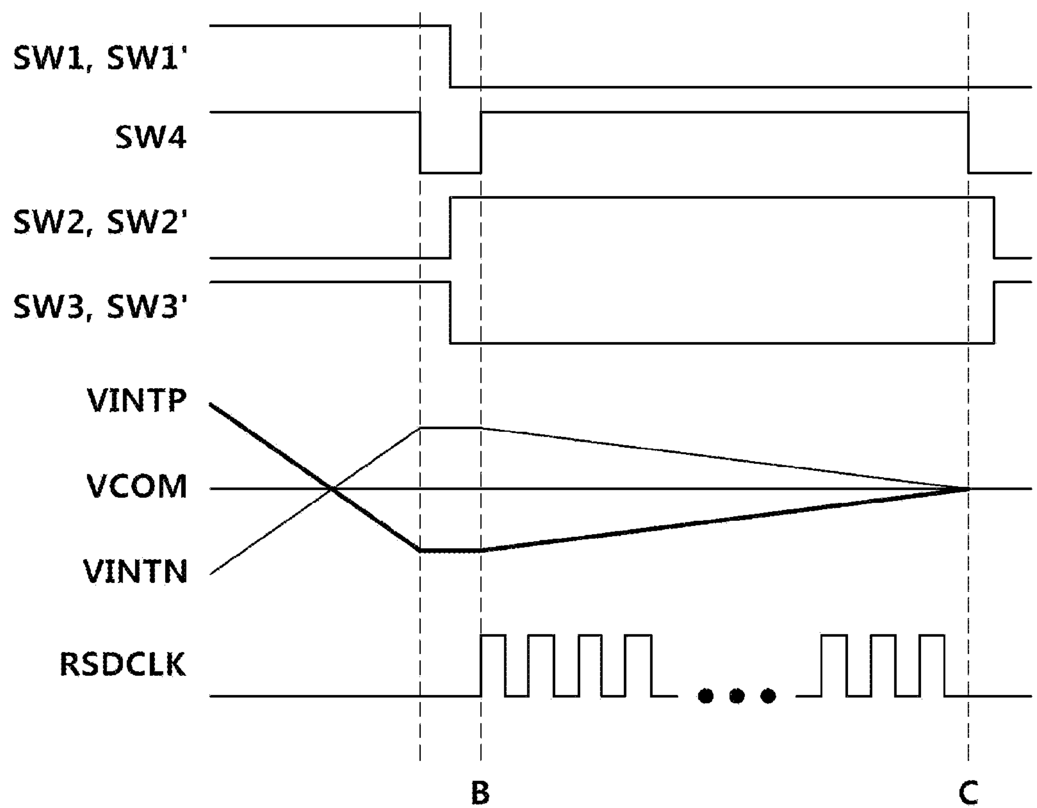

The said residue bit is like $T_{rsd}$ section in FIG. 3. Referring to FIGS. 5 and 6 in connection with this, it is recorded as discussed below. That is, prior to a point at which a comparator 160 normally outputs a high level signal in a run-down section, the positive output voltage VINTP and the negative output voltage VINTN may become the same or the positive output voltage VINTP may be larger than the negative output voltage VINTN or the positive output voltage VINTP may be smaller than the negative output voltage VINTN. Then, a residue bit to be processed between point B to point C in FIGS. 5 and 6 exists.

In such cases, where a residue bit exists at the time of an integral operation of the integrating analog-digital converter, the examples process the residue bit by the control logic unit 170.

Accordingly, the control logic unit 170 is configured to process in accordance with an output state of the comparator 160 by which a voltage value of the positive output voltage VINTP and a voltage value of the negative output voltage VINTN are compared. The output of the comparator 160 is divided into a positive value (+) and a negative value (−).

First, there is shown a case where a comparison results has a negative value (−) as in FIG. 5.

In this case, the control logic unit 170 blocks the positive input voltage VINP and the negative input voltage VINN by turning SW1 and SW1' off. It then turns SW2 and SW2' off and turns SW3 and SW3' on, thereby connecting the positive reference voltage VRFN being inputted, by means of an inverting terminal (−) of a differential amplifier 140. A non-inverting terminal (+) connects the negative reference voltage VRFP. When then turning on the SW4 switches on, a current which is accumulated in a capacitor CF is to be discharged as a reference voltage, such that here, the number of the residue clocks RSDCLK is counted. The count of the residue clocks continues until an output of the comparator is changed from a negative value (−) to a positive value (+), followed by storing a final count value when the output of the comparator is changed to a positive value (+). The final output value is derived by a calculation of adding the residue values to the first calculation value which is processed by the control logic unit 170 and then outputting that value.

In contrast to this case, there is shown a case where a comparison result has a positive value (+) as in FIG. 6.

In this case, the control logic unit 170 blocks the positive input voltage VINP and the negative input voltage VINN by turning SW1 and SW1' off. It then turns SW2 and SW2' on and turns SW3 and SW3' off, thereby connecting a VRFP being inputted, by means of an inverting terminal (−) of a differential amplifier 140. A non-inverting terminal (+) connects a VRFN. When then turning the SW4 switches on, a current is charged to a capacitor CF as a reference voltage, such that here, the number of residue clocks RSDCLK is counted. The count of the residue clocks continues until an output of the comparator is changed from a positive value (+) to a negative value (−), followed by storing a final count value when the output of the comparator is changed to a negative value (−). The final output value is derived by a calculation of subtracting the residue values from the first calculation value which is processed by the control logic unit 170 and then outputting that value.

In cases where the residue bit exists as above, a step of calculating a residue value to the first calculation value is additionally performed as discussed, so as to properly handle such a residue bit.

Meanwhile, in cases where the positive input voltage VINP and the negative input voltage VINN, which are analog values applied from outside into an integrating analog-digital converter of the examples disclosed herein, are equal to a VCOM that is a common voltage, there is a situation where the difference value thereof is namely 0 or zero. In this case, the positive reference voltage VRFP and the reference voltage VRFN are in opposite direction only and have the same value, such that the total number of run-up and the number of run-down become substantially identical. Therefore, in this situation a final output value that is outputted by a control logic unit 170 becomes 0 or zero.

As discussed above, the examples apply a differential amplifier to an integrating analog-digital converter, thereby providing an analog-digital converter configured to be resistant to noise and capable of outputting a stable output value.

In the meantime, the present disclosure is designed such that switches SW2, SW2', SW3, and SW3' shift a switch state in each different state, at points at which a run-up section is changed to a run-down section and at which one cycle of the run-up section and the run-down section is completed, as set forth above.

Accordingly, it is possible that a section where SW2, SW2', SW3, and SW3' are simultaneously turned on exists. For example, at the moment SW2 is turned on and SW3 is turned off, a point at which SW2 and SW3 are simultaneously turned on is potentially generated. Accompanying switching noise is then generated. Also, all switches are in a state of being turned on. Consequently, a current consumption is accordingly relatively large.

Therefore, in the examples, a control logic unit 170 controls a switch timing so as to turn off all of switches SW4 that are connected with a rear end in advance, when SW2 and SW3 are shifted. An input portion of an integrator 150 then assumes a floating state. In this process, a section where SW2 and SW3 and SW2' and SW3' are simultaneously turned on is removed, thereby enabling a switching noise to be removed and current consumption to be saved, also a positive reference voltage VRFP or a negative reference voltage VRFN to be stably provided. In FIG. 3, such sections are indicated as FLAT1, FLAT2, and FLAT3.

As discussed above, according to the examples, there are provided a differential amplifier used in an analog-digital converter and a circuit using such an analog-digital converter improved not only to simultaneously block an input voltage and a reference voltage but also to logically process a residue bit, so as to be resistant to noise, to save power and to reduce a circuit size, to thereby improved functioning and minimize cost.

Meanwhile, the integrating analog-digital converter of the present examples is applicable to a variety of sensors configured to output an analog value to a digital value. For example, the converter is potentially widely used in such applications as a temperature sensor, a red-green-blue (RGB) sensor, a light sensor, a proximity sensor, and similar sensors.

The apparatuses and units described herein may be implemented using hardware components. The hardware components may include, for example, controllers, sensors, processors, generators, drivers, and other equivalent electronic components. The hardware components may be implemented using one or more general-purpose or special purpose computers, such as, for example, a processor, a controller and an arithmetic logic unit, a digital signal processor, a microcomputer, a field programmable array, a programmable logic unit, a microprocessor or any other device capable of responding to and executing instructions in a defined manner. The hardware components may run an operating system (OS) and one or more software applications that run on the OS. The hardware components also may access, store, manipulate, process, and create data in response to execution of the software. For purpose of simplicity, the description of a processing device is used as singular; however, one skilled in the art will appreciate that a processing device may include multiple processing elements and multiple types of processing elements. For example, a hardware component may include multiple processors or a processor and a controller. In addition, different processing configurations are possible, such as parallel processors.

The methods described above can be written as a computer program, a piece of code, an instruction, or some combination thereof, for independently or collectively instructing or configuring the processing device to operate as desired. Software and data may be embodied permanently or temporarily in any type of machine, component, physical or virtual equipment, computer storage medium or device that is capable of providing instructions or data to or being interpreted by the processing device. The software also may be distributed over network coupled computer systems so that the software is stored and executed in a distributed fashion. In particular, the software and data may be stored by one or more non-transitory computer readable recording mediums. The media may also include, alone or in combination with the software program instructions, data files, data structures, and the like. The non-transitory computer readable recording medium may include any data storage device that can store data that can be thereafter read by a computer system or processing device. Examples of the non-transitory computer readable recording medium include read-only memory (ROM), random-access memory (RAM), Compact Disc Read-only Memory (CD-ROMs), magnetic tapes, USBs, floppy disks, hard disks, optical recording media (e.g., CD-ROMs, or DVDs), and PC interfaces (e.g., PCI, PCI-express, WiFi, etc.). In addition, functional programs, codes, and code segments for accomplishing the example disclosed herein can be construed by programmers skilled in the art based on the flow diagrams and block diagrams of the figures and their corresponding descriptions as provided herein.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An integrating analog-digital converter comprising:

an input unit configured to receive an input voltage and a predetermined reference voltage;

a differential amplifier configured to receive and amplify a differential input voltage based on the input voltage that is outputted through an output terminal of the input unit;

a comparator configured to compare a differential output voltage that is outputted from the differential amplifier; and a control logic unit configured to output a counted digital output value, in accordance with a result of the comparator, as a final output value.

2. The integrating analog-digital converter of claim 1, wherein the input unit comprises:

a first switch that is connected with a node configured to be provided with a positive input voltage;

a second switch that is connected with a node configured to be provided with a negative input voltage;

a third switch and a fourth switch that are connected with a node configured to be provided with a positive reference voltage;

a fifth switch and a sixth switch that are connected with a node configured to be provided with a negative reference voltage; and additional switches that are connected with respective rear ends of the first switch, the second switch, a first node connecting the third switch and the fifth switch, and a second node connecting the fourth switch and the sixth switch.

3. The integrating analog-digital converter of claim 2, wherein the control logic unit outputs a switch control signal that turns-on and turns-off the third switch, the fourth switch, the fifth switch, the sixth switch, and the additional switches among the switches based on a result of the comparator, and wherein the additional switches are simultaneously turned-on and turned-off.

4. The integrating analog-digital converter of claim 3, wherein the third switch and the fifth switch and the fourth switch and the sixth switch operate in opposite states to each other, and wherein in response to the third switch and the sixth switch, and the fourth switch and the fifth switch shifting a state, the additional switches are simultaneously placed in a turned-off state.

5. The integrating analog-digital converter of claim 4, wherein in a time period in which the additional switches turned off, an inverting input voltage and a non-inverting input voltage of the differential amplifier are in a floating state or the differential output voltage of the differential amplifier is maintained as being unchanged.

6. The integrating analog-digital converter of claim 5, wherein in response to the additional switches being in a turned-off state, all of the reference voltages and the input voltages are blocked from providing a supply.

7. The integrating analog-digital converter of claim 6, wherein in response to the additional switches being turned on again, if the additional switches are initially turned-off, and the third switch and the sixth switch and the fourth switch and the fifth switch shift a state, and a state shift is then complete.

8. The integrating analog-digital converter of claim 3, wherein a result of the comparator is a high level signal that is outputted in response to a positive output voltage and a negative output voltage of the differential amplifier being identical to each other.

9. The integrating analog-digital converter of claim 8, wherein the positive output voltage and the negative output voltage have a run-up section, a floating section and a run-down section during a cycle.

10. The integrating analog-digital converter of claim 9, wherein a resolution of the integrating analog-digital converter is determined by controlling a ratio of the length of the run-up section and the length of the run-down section, and a number of cycles of repetition.

11. The integrating analog-digital converter of claim 1, wherein the control logic unit verifies a presence or an absence of a residue bit based on the result of the comparator.

12. The integrating analog-digital converter of claim 10, wherein the control logic unit outputs the final output value based only on the result of the comparator in response to the residue bit being absent.

13. The integrating analog-digital converter of claim 11, wherein the final output value is determined by subtracting the total number of the run-ups from the total number of the run-downs.

14. The integrating analog-digital converter of claim 10, wherein the control logic unit outputs the final output value based on recalculating according to an output state of the comparator, in response to the residue bit being present.

15. The integrating analog-digital converter of claim 14, wherein the control logic unit, in response to an output state of the comparator being negative, outputs a value for which a time discharged to a negative reference voltage is counted by adding a first calculation value, as the final output value.

16. The integrating analog-digital converter of claim 14, wherein the control logic unit, in response to an output value of the comparator being positive, outputs a value for which a time charged to a positive reference voltage is counted by subtracting a first calculation value, as the final output value.

17. The integrating analog-digital converter of claim 15, wherein the first calculation value is defined by subtracting the total number of the run-ups from the total number of the run-downs during a cycle of the converter.

18. The integrating analog-digital converter of claim 16, wherein the first calculation value is defined by subtracting the total number of the run-ups from the total number of the run-downs during a cycle of the converter.

19. The integrating analog-digital converter of claim 12, wherein in response to a difference between the positive input voltage and the negative input voltage being 0, the control logic unit outputs the final output value as 0.

20. An integrating analog-digital converter comprising:

a differential amplifier configured to receive and amplify a differential input voltage based on an input voltage and a predetermined reference voltage from an input unit, wherein the transmission of the input voltage and the predetermined reference voltage into the differential amplifier is regulated by switches;

a comparator configured to compare a differential output voltage that is outputted from the differential amplifier; and a control logic unit configured to output a counted digital output value, in accordance with a result of the comparator, as a final output value, and configured to output a switch control signal that controls the switches in accordance with a result of the comparator.

* * * * *